United States Patent [19]

Gardeski

[11] Patent Number: 5,194,307

[45] Date of Patent: Mar. 16, 1993

[54] HIGH PERFORMANCE EPOXY BASED COVERLAY AND BOND PLY ADHESIVE WITH HEAT ACTIVATED CURE MECHANISM

[75] Inventor: Thomas F. Gardeski, Tempe, Ariz.

[73] Assignee: Martin Processing, Inc., Martinsville, Va.

[21] Appl. No.: 846,693

[22] Filed: Mar. 6, 1992

Related U.S. Application Data

[60] Division of Ser. No. 618,525, Nov. 26, 1990, Pat. No. 5,095,077, which is a continuation of Ser. No. 481,794, Feb. 15, 1990, abandoned, which is a continuation of Ser. No. 153,140, Feb. 8, 1988, abandoned.

[51] Int. Cl.$^5$ .................. B32B 7/12; B32B 15/04; C09J 4/00
[52] U.S. Cl. .................. 428/40; 156/330; 156/331.1; 156/331.5; 428/343; 428/457; 428/473.5
[58] Field of Search .............. 528/119, 361, 109; 525/438; 428/457, 473.5, 40, 343; 156/330, 331.1, 331.5

[56] References Cited

U.S. PATENT DOCUMENTS

| | | | |
|---|---|---|---|
| 3,079,367 | 2/1963 | Fram et al. | 528/119 |
| 3,182,041 | 5/1965 | Watkins et al. | 525/438 |
| 3,502,618 | 3/1970 | Uelzmann et al. | 528/361 |
| 3,576,786 | 4/1971 | Kalfayan et al. | 528/109 |
| 3,580,799 | 5/1971 | Uelzmann et al. | 528/109 |
| 5,095,077 | 3/1992 | Gardeski | 525/438 |

FOREIGN PATENT DOCUMENTS

| | | | |
|---|---|---|---|
| 0022636 | 1/1981 | European Pat. Off. | 3/14 |
| 0200678 | 3/1986 | European Pat. Off. | 59/18 |
| 68319 | 1/1979 | Japan | 525/438 |
| 61-19677 | 1/1986 | Japan . | |

*Primary Examiner*—Thomas J. Herbert, Jr.
*Attorney, Agent, or Firm*—Charles E. Cates; Frank T. Barber

[57] ABSTRACT

A high performance, laminating, coverlay, and bond ply adhesive material includes one or more epoxy components which inter-react with a high molecular weight polyester component through a two-stage reaction sequence. The first stage of the reaction sequence includes a reaction between a aziridine cure component and a polyester component. The second stage of the sequence involves a reaction between the aziridine/polyester component and the epoxy component(s). The resulting adhesive material provides a flexible, fully cross linked adhesive material with good Z-axis stability and without the evolution of volatile by-products. This resulting adhesive material can be used in bonding polyimide films to etched circuit patterns to provide a high temperature resistant, solvent resistant, moisture resistant, insulating material with good flow properties under normal electronic circuit processing and environmental conditions. The adhesive material can be used as a bond ply adhesive material for flexible base, hardboard, and multilayer electronic circuit material applications, as well as surface to surface bonding of other materials. In addition, the adhesive material, prior to the second reaction, is stable and has a long shelf life.

16 Claims, No Drawings

HIGH PERFORMANCE EPOXY BASED COVERLAY AND BOND PLY ADHESIVE WITH HEAT ACTIVATED CURE MECHANISM

This is a divisional of copending application Ser. No. 07/618,525, filed on Nov. 26, 1990, U.S. Pat. No. 5,095,077; which was a continuation of Ser. No. 07/481,794 filed on Feb. 15, 1990, now abandoned, which was a continuation of Ser. No. 07/153,140 filed on Feb. 8, 1988, now abandoned.

BACKGROUND OF THE INVENTION

During the past quarter century, the growth of the electronic circuits industry at an unrivaled pace has resulted in the development of higher performance materials of construction. However, the development of higher performance materials of construction has not resulted in the development of corresponding high performance adhesive materials and systems to bond the materials of construction together, especially in severe environmental conditions found in under-the-hood automotive and military applications. Adhesive materials and systems that are currently available meet some of the requirements for such properties as peel strength, chemical resistance, moisture resistance, high temperature stability, dimensional stability especially in the Z-axis direction, adequate flow, room temperature storage stability prior to processing and ease of processing, but typically fail to meet one or more of the requirements for one or more of the properties.

A need has therefore been felt for an adhesive material that meets all the requisite property requirements for severe environmental conditions while retaining the ease of application.

SUMMARY OF THE INVENTION

It is an object of the present invention to provide an improved adhesive material.

It is a feature of the present invention to provide an improved adhesive material for use in bonding electronic circuit construction materials.

It is another feature of the present invention to provide an adhesive material using a two stage reaction sequence.

It is yet another feature of the present invention to provide an adhesive material using a two stage reaction sequence wherein the intermediate adhesive material resulting from the first reaction stage can be stored for long periods of time without deterioration of the properties of the adhesive material.

It is a still further feature of the present invention to provide an improved adhesive material by providing a first reaction between an aziridine component and a polyester component and by providing a second reaction between the aziridine/polyester component and at least one epoxy component, the at least one epoxy component being an electronic grade resin.

The foregoing and other features are accomplished, according to the present invention, by reacting a hydroxyl terminated polyester component with an aziridine cure component, the reaction proceeding at room temperature. The resulting polyester/aziridine component reacts with at least one and preferably two epoxy components, one of the epoxy components being an electronic grade resin such as tris methane novolac epoxy. The second reaction requires a temperature of 250° to 400° F. The high reaction temperature permits the unreacted intermediate mixture of the polyester/aziridine component and the epoxy component(s) to have a long shelf life, during which the implementation of the second reaction phase will result in high performance bonding. The intermediate mixture can be stored on a substrate protected by a release substrate or can be stored between two release substrates until needed.

These and other features of the present invention will be understood from the following description.

DESCRIPTION OF THE PREFERRED EMBODIMENT

The composition of materials of the present invention comprises at least one and preferably two epoxy components, one epoxy component of which must be selected from a family of electronic grade resins such as the product tris methane epoxy novolac sold by The Dow Chemical Company under the trademark Quatrex 5010. The optional components are epoxies such as the flexible "bis-epi" and hand "novolac" products sold by The Celanese Corporation under the trademark Epi-Rez 5132 and sold by The Dow Company under the trademark D.E.N. 438, respectively. The composition of materials includes a high molecular weight hydroxyl terminated polyester component with minimal carboxcylic acid functionality, such as the product sold by The DuPont Company under the trademark 49002 and an aziridine curative component such as the product sold by Cordova Chemical Co. under the trademark Xama 2 or Xama 7.

The DuPont 49002 polyesters are members of the well known group of hot melt adhesives having melt temperatures of at least about 150° C. A chemist ordinarily skilled in the art of making resins can make similar polyesters containing the following acids:

Terephthalic acid from 30-80%;
Isophthalic acid from 10-50%;
Sebacic acid or other aliphatic diacids from 20-40%, all adjusted to 100%; plus
a variety of diols such as ethylene glycol, 1.3 propylene glycol, 1.4 butane diol and 2.2 dimethylene—1.3 propylene glycol; plus
1-10% of triol or a higher polyhydric alcohol.

The molar ratio of acid to alcohol should be very close to 1.1, counting the triol as a diol.

These are common examples and the range of possible acids and diols that could be used is much greater.

The two stage cure (reaction) sequence consists of first reacting the aziridine or bis-aziridine with the carboxylic acid groups on the polyester as follows:

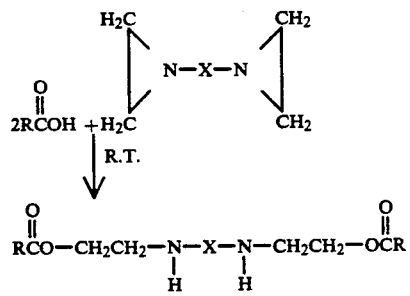

where R designates the high molecular weight polyester components and X designates the repeating unit of the aziridine component. This reaction takes place at room temperature.

The second reaction, which is unique to the present invention, is comprised of reacting the

groups formed in the first reaction with the epoxide

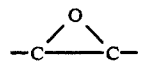

groups of the epoxy components as follows:

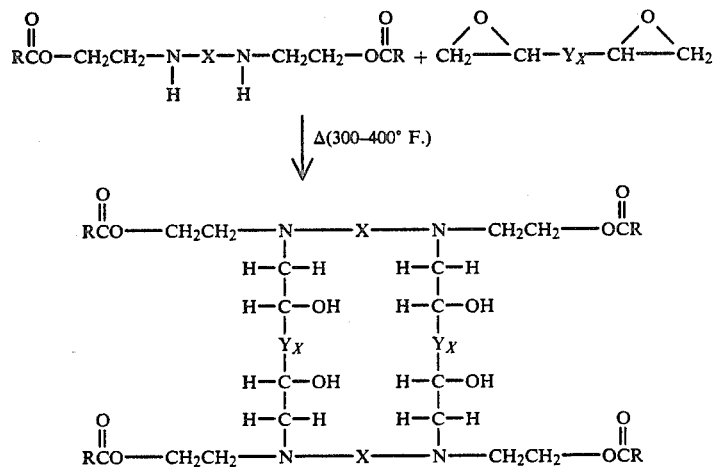

where $Y_x$ designates the tris methane epoxy either alone or in conjunction with a bis-epi and/or novolac epoxy having structures shown below:

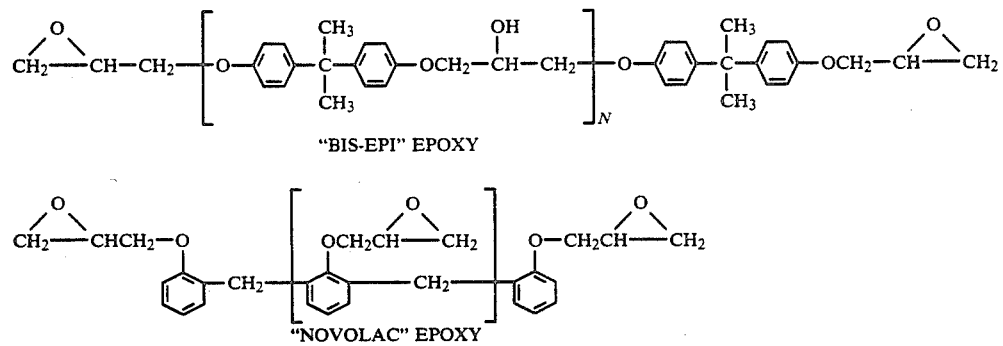

solids content (by weight) of the epoxy novolac to 10% by solids content (by weight) of the electronic grade epoxy and 0.25 parts (by weight) of the aziridine to 100 parts (by weight) of the above mixture including solvents. The component mixture can be prepared in two ways:

Procedures 1) The polyester and aziridine are combined, thoroughly mixed, then allowed to stand at room temperature for a minimum of 30 minutes prior to the epoxy additions to allow onset of the aziridine/carboxyclic acid reaction; or Procedure 2) The polyester, epoxies, and aziridine are added separately without any mixing until all the components are in the vessel then thoroughly blended and allowed to stand for a minimum of 30 minutes prior to use to allow for onset of the aziridine/carboxycylic acid reaction.

EXAMPLE OF THE PROCESS

A mixture is prepared with the following components: a polyester resin component having a solids content of 17–20%, composed of the DuPont product sold under the trademark 49002 base resin in a solvent mixture of 90% methylene chloride and 10% cyclohexanone by weight; an epoxy novolac is dissolved in methylethyl ketone, with a 85% solids content (by weight), the product being sold by Dow under the trademark D.E.N. 438; an electronic grade epoxy resin at 75% solids in methylethyl ketone the product being sold by Dow under the trademark Quatrex 5010; and a polyfunctional aziridine sold by Cordova Chemical Company under the trademark Xama 7. The components mixture is prepared by combining 80% by solids content (by weight) of the polyester component to 10% by The homogeneous solution is then applied by reverse roll coating technique to a 2 mil polyimide (e.g., Kapton) film to yield a 1 mil dry coating on the polyimide film. The polyimide film is dried in a 75 foot over at 25 fpm (feed per minute) and 212° F., combined to a 1 mil release substrate at the coater/laminator combining station, rolled up and stored at room temperature for further use. (According to another application, the homogeneous solution is stored between two release substrates, the adhesive material thereby being available for use with any surfaces to be bonded.)

Sections are cut from the roll, the release substrate is removed, then the coated film was placed over a sheet of 1 oz. copper. The composite structure is then placed between two caul plates with a high temperature release material on both sides and pressed in a hydraulic press for 1 hour at 375° F. and 250 psi pressure. The resulting composite laminate structure exhibits the properties exhibited in Table I when tested in accordance with the ANSI/IPC-FC-232B and 241B procedures.

TABLE I

| | |
|---|---|
| Initial Peel | 20 PLI |
| Peel After Solder | 21 PLI |
| Chemical Resistance | |
| MEK | 21 PLI |
| TOL | 20 PLI |
| IPA | 21 PLI |
| T111/MC | 21 PLI |
| Solder Float | Pass |
| Aging (96 hrs @ 275° F. in air circulating oven) | No Bond Strength Change | where
PLI = Pounds per lineal inch
MEK = Methylethyl ketone
TOL = Toluene
IPA = Isopropyalcohol
T111 = Trichloroethylene
MC = Methylene chloride

OTHER EXAMPLES

1. The adhesive mixture is coated on polyimide and laminate film to foil in line at 300° F. and 90–100 psi pressure. The resulting structure is post cured for 2 hours at 150° F., 2 hours @ 275° F. and 2 hours at 350° F.

2. Coat release substrate and combine to another release substrate to yield an unsupported film.

The adhesive composition of the present invention provides a coverlay and bond ply adhesive coating material consisting of 50–90% by weight polyester and 90–50% by weight epoxy with unique latent heat reactive cure mechanism comprised of one and preferably two epoxy components, one of which must be selected from a family of electronic grade resins such as tris methane epoxy novolac and the other epoxy or epoxies from the novolac or bis-epi epoxy families and a high molecular weight hydroxyl terminated polyester with a carboxyclic acid functionality as determined by an acid number ranging from 0.2 to 4.0. The adhesive material is cured in a two stage reaction sequence to provide a fully crosslinked network without the evolution of volatile by-products to provide an advanced laminating, coverlay, and bond ply adhesive for film to film, foil to film, foil to foil and hardboard to hardboard applications. .The adhesive material has with excellent flexibility, superior bond strength, solder resistance, moisture and chemical resistance and superior Z-axis stability along with continuous and/or deferred processing capability. The high temperature of the second stage curing process provides that the coating material can be stored for long periods of time prior to the implementation of the curing process. The epoxy based adhesive materials can be coated on an insulating film or release substrate by a continuous process and stored at room temperature indefinitely prior to further processing, or laminated in-line to various foils or films, and which can be cured without the evolution of volatile by-products to provide a flexible bond-ply with superior overall properties to any currently available system with the added advantage of excellent Z-axis stability.

The foregoing description is included to illustrate the operation of the preferred embodiment and is not meant to limit the scope of the invention. The scope of the invention is to be limited only by the following claims.

From the foregoing description, many variations will be apparent to those skilled in the art that would yet be encompassed by the spirit and scope of the invention.

What is claimed is:

1. The composite structure comprising a first construction material; a second construction material; and an adhesive material between a first surface of said first construction material and a first surface of said second construction material, said adhesive material including:
   (a) the reaction product of an aziridine with at least one polyester compound having a melting point of at least about 150 degrees C. and being the reaction product of at least one aromatic diacid, at least one aliphatic diacid, at least one diol and at least one triol or higher polyhydric alcohol; and
   (b) an epoxy component selected from the family of electronic grade resin epoxy components.

2. The composite structure of claim 1 wherein said first and said second construction materials are chosen from the group comprising polyimide films, metal foils and hardboards.

3. The composite structure of claim 1 wherein said electronic grade resin component is a tris methane novolac epoxy component.

4. The composite structure of claim 1 wherein said epoxy component includes at least one additional epoxy component selected from the groups of bis-epi epoxy components and novolac epoxy components.

5. The composite structure of claim 1 wherein said aziridine component and said polyester component are combined by a first reaction, said aziridine/polyester component combined in a second reaction wherein

in said aziridine/polyester component reacts with

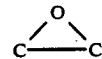

groups in said epoxy component.

6. The composite structure of claim 1 wherein said first and said second construction material are release substrates; wherein a combination of said aziridine component, said polyester component and said epoxy component have not been heated.

7. A process for preparing a composite structure or a storage media comprising:
   reaction an aziridine with at least one polyester compound having a melting point of at least about 150 degrees C. and being the reaction product of at least one aromatic diacid, at least one aliphatic diacid, at least one diol and at least one triol or higher polyhydric alcohol to form an aziridine/polyester product;
   mixing said aziridine/polyester product with at least a tris (hydroxyphenyl) methane novolac epoxy; and
   applying a resulting mixture to a location requiring said adhesive material prior to reaction between said aziridine/polyester product and said epoxy.

8. The process of claim 7 wherein the aziridine/polyester product is reacted with a tris (hydroxyphenyl) methane novolac epoxy in combination with a bisphenolepichlorohydrin epoxy or a novolac epoxy or both.

9. The process of claim 7 further comprising using 50%-90% by weight of said polyester and 90%-50% by weight of said epoxy.

10. The process of claim 7 wherein reacting of said epoxy with said aziridine/polyester product includes a step of heating a mixture of said epoxy and said aziridine/polyester product to a temperature between 250 degrees F. and 400 degrees F.

11. The process of claim 7 wherein said aziridine, said polyester and said epoxy are mixed together prior to reacting.

12. An article having two surfaces bonded together by applying to said surfaces the said resulting mixture of claim 7 and causing a reaction between said aziridine/polyester product and said epoxy.

13. A composite article with film to film bonding, foil to foil bonding, or foil to film bonding having surfaces bonded together by applying to said surfaces the said resulting mixture of claim 7 and causing a reaction between said aziridine/polyester product and said epoxy.

14. A mixture for application to surfaces to be bonded together prepared in accordance with claim 7.

15. The process of claim 7 wherein said location requiring said adhesive material is a substrate selected from the group including film substrates, foil substrates and hardboard substrates.

16. An adhesive coating storage media for application to a surface to be bonded to a second surface, said media including at least one release substrate with an adhesive coating applied thereto, said coated substrate being prepared as described in claim 15.

* * * * *

UNITED STATES PATENT AND TRADEMARK OFFICE
CERTIFICATE OF CORRECTION

PATENT NO. : 5,194,307
DATED : March 16, 1993
INVENTOR(S) : Thomas F. Gardeski

It is certified that error appears in the above-identified patent and that said Letters Patent is hereby corrected as shown below:

Column 6, line 39, --groups-- is inserted before "in"

Signed and Sealed this

Ninth Day of November, 1993

Attest:

BRUCE LEHMAN

Attesting Officer

Commissioner of Patents and Trademarks